(12) United States Patent
Xiong et al.

(10) Patent No.: US 12,727,120 B2
(45) **Date of Patent: *Sep. 1, 2026**

(54) COMBINATION HEAT DISSIPATION UNIT

(71) Applicant: ASIA VITAL COMPONENTS (CHINA) CO., LTD., Shenzhen (CN)

(72) Inventors: Xiwen Xiong, Shenzhen (CN); Xingxing Lyu, Shenzhen (CN); Wei Liu, Shenzhen (CN); Lei Yao, Shenzhen (CN)

(73) Assignee: ASIA VITAL COMPONENTS (CHINA) CO., LTD, Shenzhen (CN)

( * ) Notice: Subject to any disclaimer, the term of this patent is extended or adjusted under 35 U.S.C. 154(b) by 196 days.

This patent is subject to a terminal disclaimer.

(21) Appl. No.: 18/387,852

(22) Filed: Nov. 8, 2023

(65) Prior Publication Data

US 2025/0151231 A1 May 8, 2025

(51) Int. Cl.
*H05K 7/20* (2006.01)
*F28D 15/02* (2006.01)
*H10W 40/73* (2026.01)

(52) U.S. Cl.
CPC ..... *H05K 7/20336* (2013.01); *F28D 15/0266* (2013.01); *H10W 40/73* (2026.01)

(58) Field of Classification Search
CPC .... F28D 15/0266–0275; H01L 23/427; H05K 7/20336
See application file for complete search history.

(56) References Cited

U.S. PATENT DOCUMENTS 7,540,318 B2 * 6/2009 Nitta .................... H01L 23/427
257/715
10,663,231 B2 * 5/2020 Tan .................... H01L 23/3736
(Continued)

FOREIGN PATENT DOCUMENTS

CN 212253782 U * 12/2020
CN 215529697 U 1/2022
(Continued)

OTHER PUBLICATIONS

Search Report dated Sep. 3, 2024, issued by Taiwan Intellectual Property Office for counterpart application No. 112140196.

*Primary Examiner* — Robert J Hoffberg
(74) *Attorney, Agent, or Firm* — Demian R. Jackson; Jackaon IPG PLLC

(57) ABSTRACT

A combination heat dissipation unit includes a vapor chamber defining an airtight chamber filled with a working fluid and at least one heat pipe having an open end. The vapor chamber is provided at an upper side with at least one through hole communicable with the airtight chamber and on a lower inner side with a first wick structure. At least one annular element is provided in the airtight chamber corresponding to the through hole. The open end of the heat pipe is correspondingly inserted into the through hole to enter the airtight chamber and contact with the annular element to be fixedly supported thereon. With these arrangements, the path and time for the working fluid to flow from the heat pipe back to the vapor chamber are largely shortened, dry burning in the vapor chamber is avoided, and two-phase heat exchange efficiency of the heat dissipation unit is upgraded.

9 Claims, 4 Drawing Sheets

(56) References Cited

U.S. PATENT DOCUMENTS

| | | | | |
|---|---|---|---|---|
| 11,788,796 | B2 * | 10/2023 | Jiang | F28F 1/12 165/104.26 |
| 12,516,890 | B2 * | 1/2026 | Xiong | F28D 15/04 |
| 2024/0147666 | A1 * | 5/2024 | Chen | H01L 23/427 |
| 2024/0147667 | A1 * | 5/2024 | Chen | H05K 7/20872 |
| 2024/0153845 | A1 * | 5/2024 | Chen | H01L 23/473 |
| 2025/0146762 | A1 * | 5/2025 | Xiong | F28D 15/0275 |
| 2025/0146763 | A1 * | 5/2025 | Xiong | F28D 15/04 |
| 2025/0176140 | A1 * | 5/2025 | Shih | F28D 15/0233 |
| 2025/0290703 | A1 * | 9/2025 | Lin | F28D 15/0233 |
| 2025/0321058 | A1 * | 10/2025 | Lin | F28D 15/0233 |
| 2025/0347472 | A1 * | 11/2025 | Lin | F28D 15/0233 |
| 2025/0354762 | A1 * | 11/2025 | Xiong | F28D 15/04 |
| 2025/0354763 | A1 * | 11/2025 | Xiong | F28D 15/04 |
| 2026/0049771 | A1 * | 2/2026 | Lin | F28D 15/0275 |
| 2026/0049772 | A1 * | 2/2026 | Lin | F28D 15/0283 |

FOREIGN PATENT DOCUMENTS

| | | | | |
|---|---|---|---|---|
| CN | 218634645 | U | 3/2023 | |
| CN | 119173007 | A * | 12/2024 | H05K 7/20327 |
| CN | 121498443 | A * | 2/2026 | G06F 1/20 |
| TW | 201728865 | A | 8/2017 | |
| TW | M608720 | U | 3/2021 | |
| TW | M621971 | U | 1/2022 | |
| TW | M630475 | U | 8/2022 | |
| TW | M653956 | U | 4/2024 | |

* cited by examiner 61
311
63
5

311
63
61
5

5
61
311
63

COMBINATION HEAT DISSIPATION UNIT

FIELD OF THE INVENTION

The present invention relates to a combination heat dissipation unit, and more particularly, to a combination heat dissipation unit that has enhanced structural strength and allows a working fluid to flow back from a condensing zone to a vaporizing zone more efficiently.

BACKGROUND OF THE INVENTION

To satisfy customers' increasing demands for good heat dissipation of electronic devices, such as computers or servers, a three-dimensional (3D) vapor chamber (VC) has been developed. Compared to a conventional two-dimensional (2D) vapor chamber, the 3D vapor chamber advantageously has higher density of integration, higher vapor diffusion rate, smaller thermal resistance, and higher upper limit of heat dissipation. In view of the constantly increased density of integration of chips in the electronic devices and the increasing requirement for heat dissipation, the conventional heat pipe and/or vapor chamber can no longer suffice the heat dissipation requirement for the high heat flux electronics, the 3D vapor chamber has been widely applied in the field of electronic device heat dissipation and gradually replaces the heat pipe and/or the vapor chamber used individually.

Please refer to FIG. 1 that is a cross-sectional view of a conventional 3D vapor chamber structure 1. As shown, the conventional 3D vapor chamber structure 1 consists of a plurality of pipes 11 and a vapor chamber 12. The vapor chamber 12 includes an upper plate member 121 and a lower plane member 122, which are closed to each other to define a flat chamber 124 between them. The flat chamber 124 has a working fluid (not shown) filled therein. The upper plate member 121 is provided with at least one opening 123, which extends through the upper plate member 121 to communicate with the flat chamber 124. The opening 123 has a rim that extends upward to form a ring portion 123*a*. A third wick structure 125 and a first wick structure 126 are provided on an inner wall surface of the upper and the lower plate member 121, 122, respectively. And, a plurality of supporting members 127 is provided in the flat chamber 124 to support and space the upper and the lower plate member 121, 122 from one another. The supporting members 127 and the openings 123 are arranged in a staggered manner to space from one another.

The pipe 11 has two ends, one of which is a closed end 111 and the other is an open end 112. The pipe 11 internally defines a tubular chamber 114 between the closed end 111 and the open end 112. The open end 112 of the pipe 11 is inserted through the opening 123 to connect with the upper plate member 121; and a joint between the ring portion 123*a* of the opening 123 on the upper plate member 121 and the open end 112 of the pipe 11 is fixedly connected together by welding. The tubular chamber 114 in the pipe 11 is communicable with the flat chamber 124 via the open end 112 of the pipe 11. And, a second wick structure 115 is provided on an inner wall surface of the tubular chamber 114.

The second wick structure 115 in the pipe 11 can be distributed to contact with or without contacting with the third wick structure 125 in the vapor chamber 12 on the inner wall surface of the upper plate member 121.

The working fluid condensed in the pipe 11 can flow back from the closed end 111 to a vaporizing zone in the vapor chamber 12 in two ways. In the first way, the condensed working fluid in the pipe 11 flows through the open end 112 of the pipe 11 to the third wick structure 125 nearby the opening 123 on the upper plate member 121 and is then collected at the third wick structure 125. When the collected working fluid reaches a predetermined volume, it drops into the vaporizing zone due to gravity. In the second way, the working fluid flows back to places near the opening 123 and is diffused horizontally with the aid of the third wick structure 125. When the diffused working fluid meets the supporting members 127, it flows downward along outer surfaces of the supporting members 127 and reaches at the first wick structure 126, from where the working fluid flows back to the vaporizing zone in the vapor chamber 12. Since the supporting members 127 are located at a distance from the opening 123, the working fluid has to flow through a considerably long path before it reaches at the vaporizing zone, resulting in low flow-back efficiency. In the case the time and the path for the working fluid to flow back to the vaporizing zone are very long and the working fluid could not flow back to the vaporizing zone in time, the vaporizing zone tends to occur dry burning due to insufficient working fluid therein.

Further, the pipe 11 and the vapor chamber 12 are horizontally fixedly welded to each other only at the joint between the ring portion 123*a* and the open end 112. That is, the pipe 11 and the vapor chamber 12 only has a line contact formed between them. The pipe 11 extended into the flat chamber 124 in the vapor chamber 12 is not vertically supported or held in place by any structure. When the pipe 11 is subjected to a vertical impact, or when the closed end 111 of the pipe 11 has radiation fins mounted thereon, it is very possible that the pipe 11 would separate from the vapor chamber 12 or become bent or even broken to cause leakage of the working fluid from the conventional 3D vapor chamber 1. The above problems in the conventional 3D vapor chamber 1 must be solved as soon as possible.

SUMMARY OF THE INVENTION

To effectively solve the problems in the prior art, it is a primary object of the present invention to provide a combination heat dissipation unit consisting of a vapor chamber and at least one heat pipe, which has enhanced overall structural strength and allows a working fluid to flow back from the heat pipe to the vapor chamber more efficiently.

To achieve the above and other objects, the combination heat dissipation unit according to the present invention includes a vapor chamber and at least one heat pipe.

The vapor chamber internally defines an airtight chamber filled with a working fluid. The vapor chamber has a lower side wall; an inner surface thereof facing toward the airtight chamber is provided with a first wick structure and forms a vaporizing zone. The vapor chamber further has an upper side wall, on which at least one through hole is formed to extend through the upper side wall and communicate the airtight chamber with a space outside the vapor chamber. The airtight chamber has at least one annular element disposed therein. The annular element has a lower end surface in contact with the first wick structure and an upper end surface located corresponding to the through hole.

The heat pipe has two ends, one of which is a closed end and the other is an open end, and a heat pipe chamber is defined in the heat pipe between the closed end and the open end. A second wick structure is provided on an inner wall surface of the heat pipe chamber. The open end of the heat pipe is correspondingly inserted through the through hole into the airtight chamber in the vapor chamber to contact with the annular element, such that the annular element provides an axial support to the heat pipe and holds the heat pipe in place.

According to the present invention, each through hole on the vapor chamber has at least one annular element located corresponding to it. The annular element not only provides an axial supporting and locating to the heat pipe inserted into the airtight chamber, but also allows the working fluid condensed in the heat pipe chamber to pass it and directly and quickly flow back to the vaporizing zone in the vapor chamber. Therefore, it is able to solve the problems that the prior art 3D vapor chamber structure has a relative weak structural strength and an overly long flow-back path that tends to cause dry burning in the vapor chamber.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
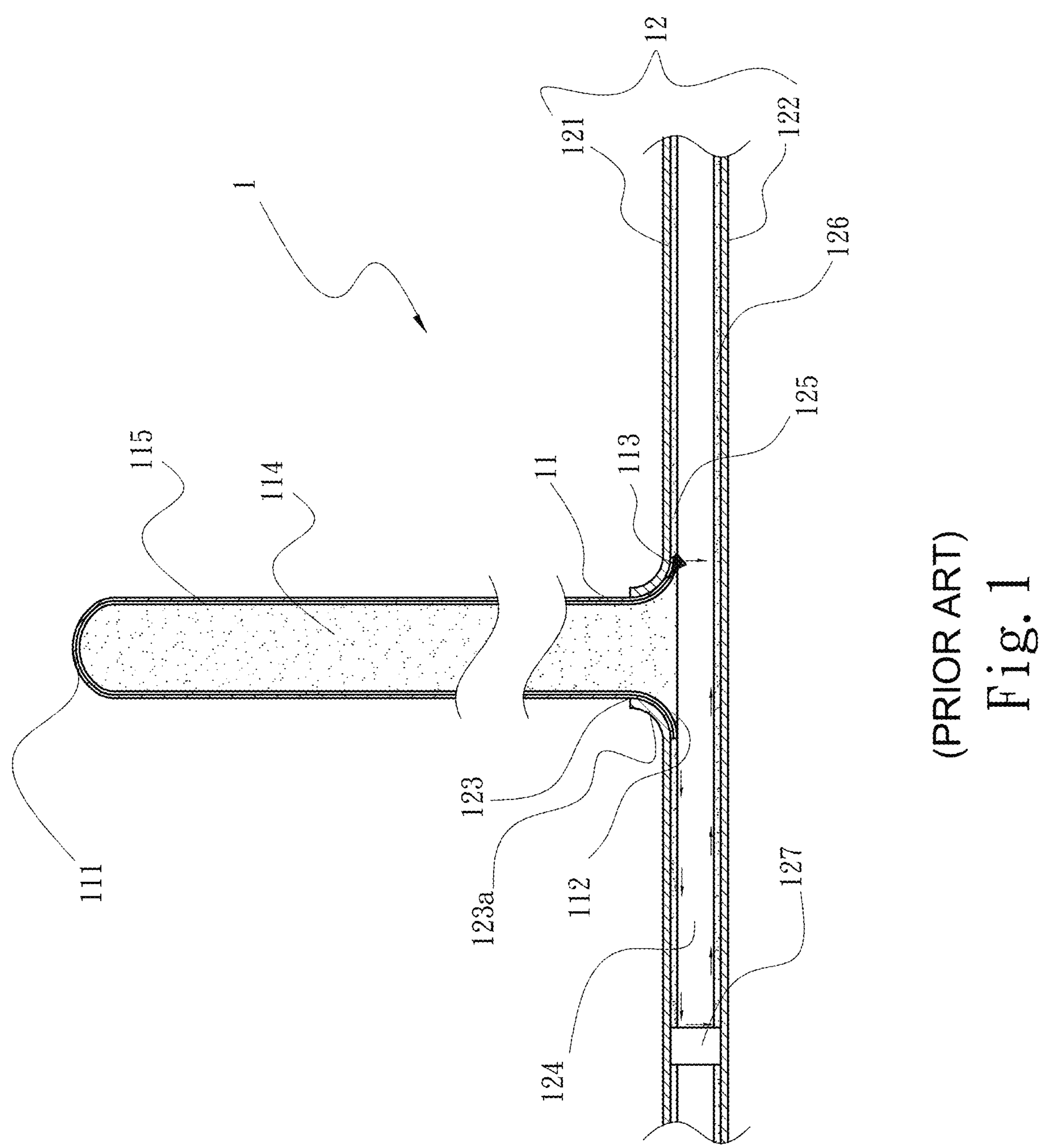
FIG. 1 is a cross-sectional view of a conventional three-dimensional (3D) vapor chamber structure.

The present invention will now be described with some preferred embodiments thereof. For the purpose of easy to understand, elements that are the same in the preferred embodiments are denoted by the same reference numerals.

Figure 2:
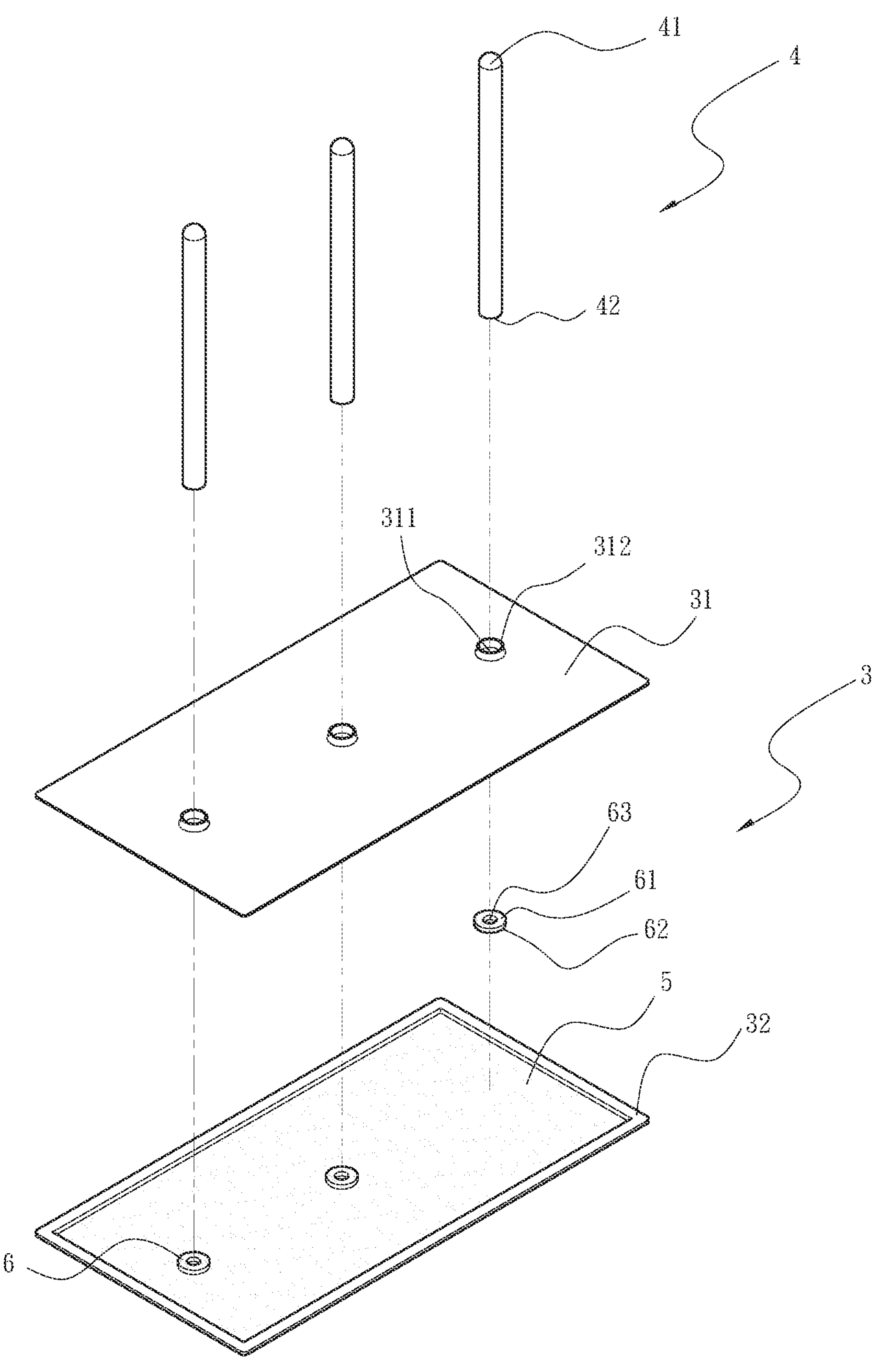
FIG. 2 is an exploded perspective view of a combination heat dissipation unit according to a preferred embodiment of the present invention.
Figure 3:
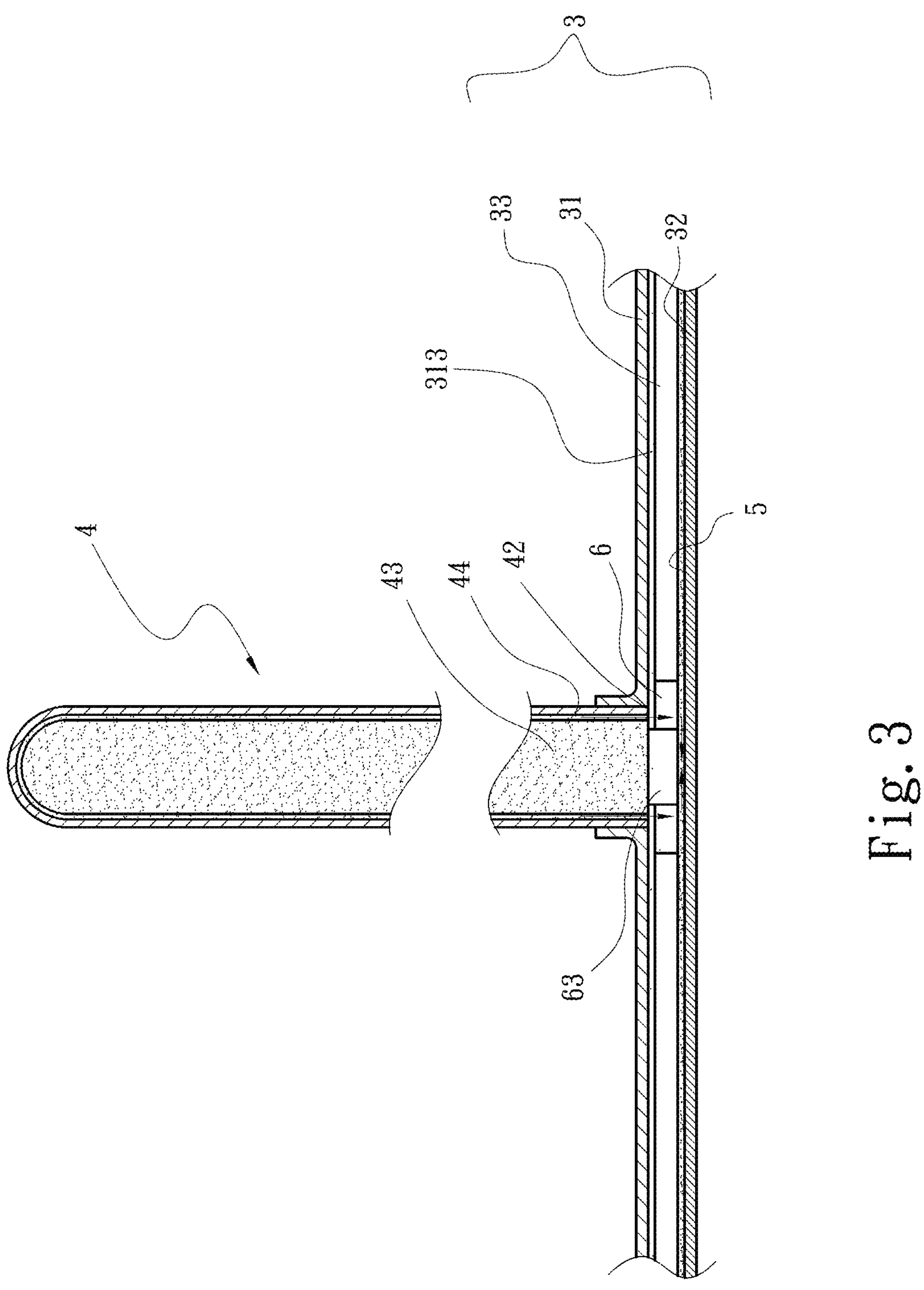
FIG. 3 is an assembled cross-sectional view of the combination heat dissipation unit of FIG. 2.
Figures 4A, 4B, 4C:
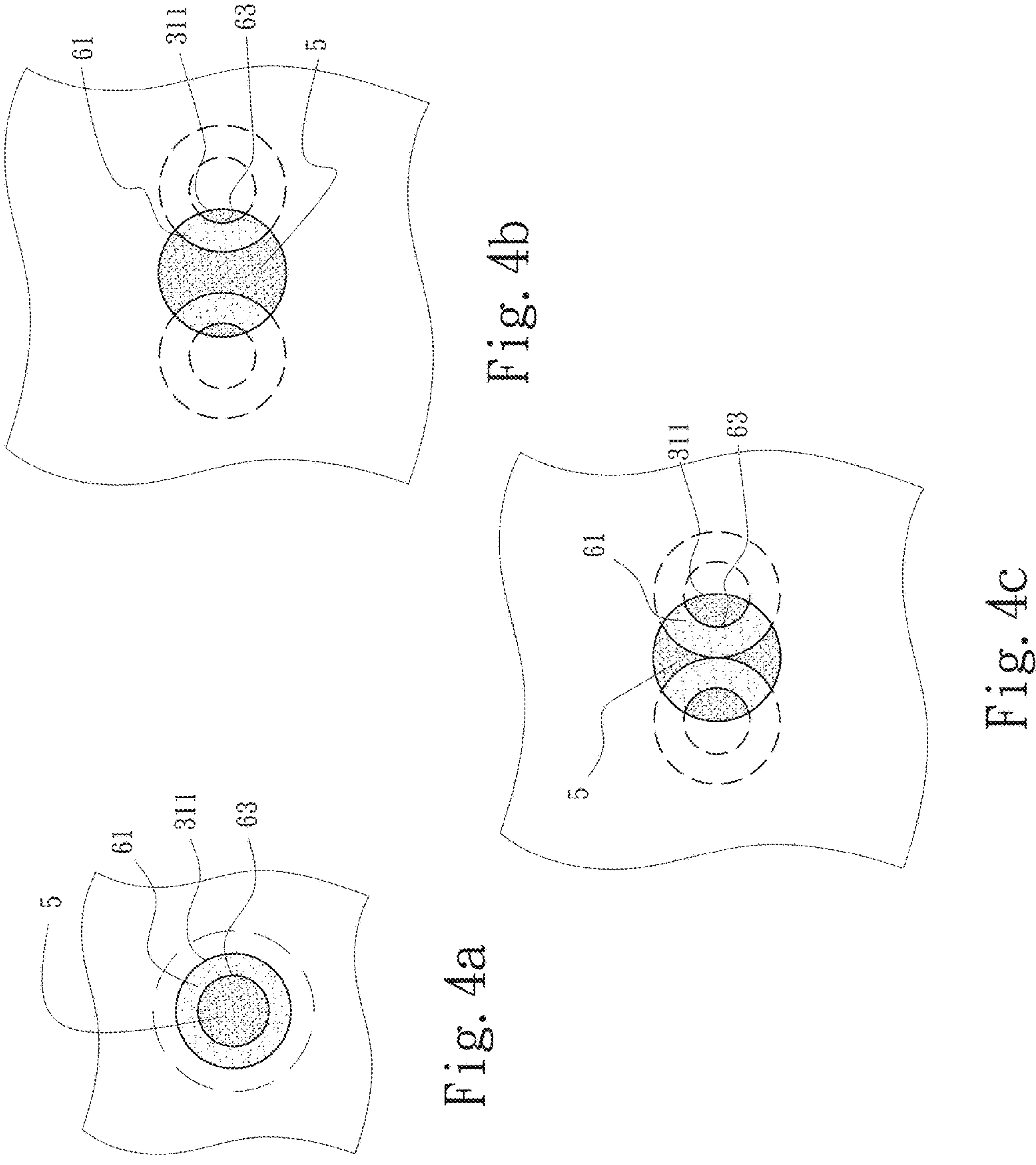
FIG. 4*a* is a top view of the combination heat dissipation unit of FIG. 2.
FIG. 4*b* is a top view of a first variant of the combination heat dissipation unit of FIG. 2.
FIG. 4*c* is a top view of a second variant of the combination heat dissipation unit of FIG. 2.

Please refer to FIGS. 2, 3, and 4*a*, which are exploded perspective view, assembled cross-sectional view and top view, respectively, of a combination heat dissipation unit according to a preferred embodiment of the present invention; and to FIGS. 4*b* and 4*c*, which are top views of a first and a second variant, respectively, of the combination heat dissipation unit according to the preferred embodiment of the present invention. As shown, the combination heat dissipation unit of the present invention includes a vapor chamber 3, at least one heat pipe 4, and at least one annular element 6.

The vapor chamber 3 is formed by closing an upper plate member 31 and a lower plate member 32 to each other, such that an airtight chamber 33 is defined in the vapor chamber between the upper and the lower plate member 31, 32. The airtight chamber 33 is filled with a working fluid (not shown). The upper plate member 31 that is located corresponding to an upper side wall of the airtight chamber 33 is provided with at least one through hole 311 that extends through the upper side wall of the airtight chamber 33 in a thickness direction thereof. Each through hole 311 formed on the upper plate member 31 of the vapor chamber 3 has an axially outward and upward protruded flange 312 extending along a rim of the through hole 311. Via the through hole 311, the airtight chamber 33 is communicable with an environment outside the vapor chamber 3 and the heat pipe 4 can be extended into the airtight chamber 33. One side of the lower plate member 32 facing toward the airtight chamber 33 serves as a vaporizing zone in the vapor chamber 3 and has a first wick structure 5 provided over a surface thereof.

The annular element 6 may be a solid or a porous structure. In the illustrated preferred embodiment of the present invention, the annular element 6 is shown as a porous structure, which provides good capillary force for the working fluid in a condensing zone in the heat pipe 4 to flow back to the vaporizing zone in the vapor chamber 3. The annular element 6 has an upper end surface 61, a lower end surface 62, and an axial bore 63 axially formed on the annular element 6 to extend through the upper and the lower end surfaces 61, 62.

Please refer to FIG. 4*a*. In the case one single annular element 6 is provided corresponding to one through hole 311, the annular element 6 can be placed with its axial bore 63 being concentric or eccentric with the through hole 311. Further, the axial bore 63 of the annular element 6 has a bore size equal to or smaller than a hole size of the through hole 311, and the annular element 6 has an outer diameter larger than the hole size of the through hole 311. With these arrangements, portions or areas of the upper end surface 61 of the annular element 6 extended between a rim of the axial bore 63 and the thorough hole 311 may serve to support the heat pipe 4 that is perpendicularly inserted into the through hole 311.

Please refer to FIGS. 4*b* and 4*c*. In the case two or more annular elements 6 are placed corresponding to one through hole 311, the annular elements 6 may be placed to space from one another, as shown in FIG. 4*b*, or be placed to be tangential to one another, as shown in FIG. 4*c*. In the above two cases, portions or areas of the upper end surfaces 61 of the annular elements 6 that overlap the through hole 311 may serve to support the heat pipe 4 that is perpendicularly inserted into the through hole 311.

The heat pipe 4 has two ends, one of which is a closed end 41 and the other is an open end 42, and internally defines a heat pipe chamber 43 extending between the closed end 41 and the open end 42. The heat pipe chamber 43 is provided on its entire inner wall surface with a second wick structure 44. The open end 42 of the heat pipe 4 is correspondingly inserted into the through hole 311 formed on the upper plate member 31 of the vapor chamber 3 to enter the airtight chamber 33 defined in the vapor chamber 3, such that the heat pipe 4 is joined to the vapor chamber 3. When the heat pipe 4 and the vapor chamber 3 are in an assembled state, the heat pipe chamber 43 and the airtight chamber 33 are communicable with each other.

The open end 42 of the heat pipe 4 is in contact with the upper end surface 61 of the annular element 6. Therefore, the open end 42 of the heat pipe 4 is extended into the airtight chamber 33 and is axially supported on the upper end surface 61 of the annular element 6. That is, the open end 42 of the heat pipe 4 is axially interfered by the annular element 6, such that the heat pipe 4 can no longer axially move deeper into the airtight chamber 33 in the vapor chamber 3. It is the annular element 6 that provides direct axial propping, locating, and supporting to the heat pipe 4 joined to the vapor chamber 3.

The working fluid vaporized in the airtight chamber 33 of the vapor chamber 3 is allowed to diffuse directly toward the heat pipe chamber 43 in the heat pipe 4, and heat carried by the vaporized working fluid is dissipated into surrounding air at a location remote from the vapor chamber 3. Since the annular element 6 is located correspondingly to the open end 42 of the heat pipe 4, the working fluid condensed in the heat pipe chamber 43 is directly guided by the annular element 6 to flow to the first wick structure 5 provided in the vaporizing zone in the vapor chamber 3. With this arrangement, the path and the time for the condensed working fluid to flow from the heat pipe 4 back to the vaporizing zone are largely shortened, enabling the working fluid to flow back faster and allowing continuous and stable two-phase heat exchange of the working fluid between the liquid phase and the vapor phase thereof to avoid the occurrence of dry burning in the vapor chamber 3.

The vapor chamber 3 can be internally provided with a plurality of supporting posts (not shown). The supporting posts and the through holes 311 are located in a staggered manner and not overlapped with each other. The annular element 6 can be externally fitted around one supporting post while overlapping one through hole 311.

In an alternative embodiment of the vapor chamber 3, an inner surface of the upper side wall of the airtight chamber 33 is provided with a third wick structure 313, which is in contact with the upper end surface 61 of the annular element 6. The working fluid condensed in the heat pipe chamber 43 diffuses into the vapor chamber 3 via the annular element 6 and quickly flows back to the vaporizing zone with the aid of the third wick structure 313.

The first wick structure 5, the second wick structure 44, and the third wick structure 313 may be formed of a sintered powder material, a woven mesh, a grid structure, or a fibrous structure. Further, the first structure 5, the second wick structure 44, and the third wick structure 313 can be formed of the same or different wick structures.

In the above described preferred embodiment, the provision of the annular element 6 not only enables good control of the depth by which the heat pipe 4 can be axially inserted into the airtight chamber 33 from an outer side of the vapor chamber 3, but also provides good axial location of the heat pipe 4 and increases the structural strength of the combined heat pipe 4 and vapor chamber 3.

Further, the provision of the annular element 6 also largely shortens the path and the time for the condensed working fluid in the heat pipe chamber 43 to flow from the heat pipe 4 through the annular element 6 back to the first wick structure 5 in the vaporizing zone of the vapor chamber 3 more quickly. Therefore, the two-phase heat exchange between the heat pipe 4 and the vapor chamber 3 can occur continuously to avoid the situation of dry burning in the vaporizing zone of the vapor chamber 3 and maintain upgraded heat exchange efficiency.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A combination heat dissipation unit comprising:

a vapor chamber having a lower side wall with a first wick structure provided on an inner surface of the lower side wall and an upper side wall with at least one through hole extending through the upper side wall and with a third wick structure arranged on an inner surface of the upper side wall; and the vapor chamber including at least one annular element corresponding to the at least one through hole and the at least one annular element having a single, uniform outer diameter and a single, planar upper end surface, wherein the single, planar upper end surface is arranged in contact with the third wick structure and the at least one annular element having a lower end surface arranged in contact with the first wick structure;

at least one heat pipe internally defining a heat pipe chamber, which is communicable with the vapor chamber; the at least one heat pipe having two ends, one of which is a closed end and another one is an open end, the open end of the at least one heat pipe being correspondingly inserted into the at least one through hole to be structurally supported on the single, planar upper end surface of the at least one annular element; the at least one annular element providing axial supporting, locating, and propping to the open end of the at least one heat pipe and thereby giving the combination heat dissipation unit enhanced overall structural strength and defining an airtight chamber; and a working fluid filled in the airtight chamber, wherein the at least one annular element and the third wick structure guide the working fluid condensed in the at least one heat pipe to flow to the first wick structure in the vapor chamber.

2. The combination heat dissipation unit as claimed in claim 1, wherein the at least one through hole formed on the vapor chamber includes an axially outward and upward protruded flange.

3. The combination heat dissipation unit as claimed in claim 1, wherein the heat pipe chamber is provided on an entire inner wall surface of the heat pipe chamber with a second wick structure and wherein the third wick structure is in contact with the second wick structure.

4. The combination heat dissipation unit as claimed in claim 3, wherein the first and the second wick structures are formed of a sintered powder material.

5. The combination heat dissipation unit as claimed in claim 1, wherein the at least one annular element has an axial bore axially formed on the at least one annular element to extend through the upper and the lower end surface of the at least one annular element.

6. The combination heat dissipation unit as claimed in claim 5, wherein the at least one annular element is concentric with the at least one through hole; the axial bore of the at least one annular element having a bore size smaller than a hole size of the at least one through hole; and the singular, uniform outer diameter of the at least one annular element is larger than the hole size of the at least one through hole.

7. The combination heat dissipation unit as claimed in claim 6, wherein the at least one annular element is a porous structure.

8. The combination heat dissipation unit as claimed in claim 5, wherein the at least one annular element is a porous structure.

9. The combination heat dissipation unit as claimed in claim 1, wherein the at least one annular element is a porous structure.

* * * * *